(12) United States Patent
Lewin et al.

(10) Patent No.: US 7,894,877 B2
(45) Date of Patent: Feb. 22, 2011

(54) SYSTEM AND METHOD FOR ADJUSTING IMAGE PARAMETERS BASED ON DEVICE TRACKING

(75) Inventors: Jonathan S. Lewin, Beachwood, OH (US); Jeffrey L. Duerk, Avon Lake, OH (US); Daniel Elgort, Cleveland Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 1775 days.

(21) Appl. No.: 10/437,661

(22) Filed: May 14, 2003

(65) Prior Publication Data

US 2004/0044279 A1    Mar. 4, 2004

Related U.S. Application Data

(60) Provisional application No. 60/381,204, filed on May 17, 2002.

(51) Int. Cl.
*A61B 5/05* (2006.01)
(52) U.S. Cl. .................. 600/424; 600/423; 600/410; 600/411; 600/407
(58) Field of Classification Search ............... 600/423, 600/424, 410, 411, 407
See application file for complete search history.

(56) References Cited

U.S. PATENT DOCUMENTS

| | | | |
|---|---|---|---|
| 5,271,400 A | 12/1993 | Dumoulin et al. | |
| 5,318,025 A | 6/1994 | Dumoulin et al. | |
| 5,715,822 A | 2/1998 | Watkins et al. | |
| 5,938,599 A * | 8/1999 | Rasche et al. | 600/410 |
| 6,246,896 B1 | 6/2001 | Dumoulin et al. | |
| 6,275,721 B1 | 8/2001 | Darrow et al. | |
| 6,275,722 B1 | 8/2001 | Vaals Van et al. | |
| 6,289,233 B1 * | 9/2001 | Dumoulin et al. | 600/410 |

FOREIGN PATENT DOCUMENTS

| | | | |
|---|---|---|---|
| EP | 0860144 | | 8/1998 |
| JP | 2000-225103 | * | 8/2000 |

OTHER PUBLICATIONS

J.M. Santos et al., "Real-Time Imaging and Active Device Tracking for Catheter-Based MRI" Proc. of the ISMRM, 9th Scientific Meeting and Exhibition.*
Zhang, Active MR Guidance of Interventional Devices With Target-Navigation, 2000, Magnetic Resonance in Medicine, 44:56-63.*

(Continued)

*Primary Examiner*—Tse Chen
*Assistant Examiner*—John F Ramirez

(57) ABSTRACT

A system for automatically adapting image acquisition parameters based on imaging and/or device tracking feedback is provided. An example system includes a subsystem for acquiring images (e.g., MR) of an object and tracking data for a device (e.g. catheter) inserted into the object and controllably moveable within the object. The system also includes an image processor for processing the images and a device tracking logic for computing device parameters (e.g., speed, direction of travel, rate of speed change, position, position relative to a landmark, device orientation). Based on the images and device parameter computations, a parameter control and adjustment logic can automatically update one or more image acquisition parameters that control the image acquisition subsystem.

18 Claims, 11 Drawing Sheets

OTHER PUBLICATIONS

Patent Abstracts of Japan, vol. 2000, No. 11 (Jan. 3, 2001).

J.M. Santos et al., "Real-Time Imaging and Active Device Tracking for Catheter-Based MRI" Proc. of the ISMRM, 9th Scientific Meeting and Exhibition, and the ESMRMB, 18th Annual Meeting and Exhibition, Held Jointly, Apr. 21-27, 2001, vol. 3, p. 2169.

Zhang Q et al., "Active MR Guidance of Interventional Devices With Target-Navigation" Magnetic Resonance in Medicine, vol. 44 (Jul. 2000), pp. 56-65.

Elgort et al., "Improved Real-time Adaptive Tracking System" Proceedings of ISMRM Conference (2003), Poster Presentation.

Elgort et al., "Adaptive Image Parameters Based on Automated Realtime Device Tracking" Proceedings of ISMRM Conference (2002), Oral Presentation.

Elgort et al., "Real-time Catheter Tracking and Adaptive Imaging" JMRI (in press 2003).

Elgort, et al., Adaptive Image Parameters Based on Automated Realtime Device Tracking, 1 pg.

Elgort, et al., Adaptive Image Parameters Based on Automated Realtime MR Catheter Tracking, 1 pg.

Elgort, et al., Adaptive Image Parameters Based on Automated Realtime MR Catheter Tracking, 2002 RSNA Abstract Submission, 1 pg.

Panych, et al., Real-time Interactive Catheter Tracking by MRI, 4 pgs. (1999).

Yeung, et al., RF Transmit Power Limit for the Barewire Loopless Catheter Antenna, Journal of Magnetic Resonance Imaging, 12:86-91 (2000).

Kramer, C.M., Cardiovascular MRI: The Future is Now, Electromedica 69 (2001) No. 2 (Suppl.), pp. 1-6.

* cited by examiner

SYSTEM AND METHOD FOR ADJUSTING IMAGE PARAMETERS BASED ON DEVICE TRACKING

CROSS REFERENCE TO RELATED APPLICATIONS

This application claims the benefit of U.S. Provisional Application 60/381,204 filed May 17, 2002, entitled System and Method for Adjusting Image Parameters Based on Device Tracking.

TECHNICAL FIELD

The systems, methods, application programming interfaces (API), graphical user interfaces (GUI), data packets, and computer readable media described herein relate generally to the magnetic resonance imaging arts. They find application to methods and systems for acquiring data (e.g., image data and/or device tracking data) and adjusting acquisition parameters based on tracking information. Although a magnetic resonance imaging (MRI) system is described herein, other applications and use with other imaging systems (e.g., computed tomography (CT), positron emission tomography (PET)) will be apparent to one of ordinary skill in the art.

BACKGROUND

Locating devices (e.g., catheters) inserted into the human body via MRI is known in the art. For example, U.S. Pat. No. 6,289,233 titled High Speed Tracking of Interventional Devices Using an MRI System describes one method for locating an inserted device (e.g., needle in needle biopsy). Similarly, the article Real-Time Interactive Catheter Tracking by MRI, Panych et. al, International Society for Magnetic Resonance in Medicine, 1999, Poster 1948, describes tracking catheter position substantially in real time. The Panych method even goes so far as to facilitate repositioning and re-orientation of a scan plane based on catheter position.

SUMMARY

Although catheter locating and/or tracking by different methods has been described elsewhere, these descriptions have not related to making automatic adjustments to image acquisition parameters based on selected motion feed back and/or feedback of a more general nature (e.g., catheter tip location) acquired during image acquisition. Thus, example systems and methods described herein relate to automatically adjusting image acquisition parameters (e.g. field of view, resolution) based on information derived from tracking catheter motion (e.g., speed, direction of travel, location relative to underlying anatomy), not simply from catheter position. This facilitates reducing and/or eliminating the need to manually adjust scan plane parameters and/or image acquisition parameters. Thus, an imager (e.g., physician), can adjust imaging parameters through an automated human/machine interface substantially in real time, where the human/machine interface is customizable.

This section presents a simplified summary of methods, systems, data packets, computer readable media and so on for automatically adjusting image acquisition parameters based on motion feedback derived during MRI imaging, to facilitate providing a basic understanding of these items. This summary is not an extensive overview and is not intended to identify key or critical elements of the methods, systems, computer readable media, and so on or to delineate the scope of these items. This summary provides a conceptual introduction in a simplified form as a prelude to the more detailed description that is presented later.

In one example, the device tracking and image analysis components of the systems and methods may be software that is executable by one or more computers, computer components, and/or other processing devices. The software may be stored in a computer readable medium such as a magnetic disk, digital compact disk, electronic memory, persistent and/or temporary memories, and others as known in the art. The systems and methods may also be implemented as hardware and/or a combination of hardware and software.

By way of illustration, a catheter insertion speed can be related to a clinician's intentions. For example, a higher catheter speed may indicate that a clinician is interested in guiding a catheter with a resulting desire for survey imaging. The survey imaging may be characterized, for example, by a large field of view (FOV), a high temporal resolution, a lower spatial resolution, a lower signal to noise ratio (SNR), and a contrast that highlights anatomical structures. The guiding may be employed while navigating to a landmark and/or while surveying for interesting locations, for example. Similarly, a slower catheter speed may indicate that the clinician is interested in detailed inspection imaging. Detailed imaging may be characterized, for example, by a smaller FOV, a lower temporal resolution, a high spatial resolution, a high SNR, and a contrast that facilitates characterizing pathology. In addition, cessation of catheter movement may indicate that the clinician is interested in a highest level of detail in imaging for use in specific tissue characterization. This may be characterized by a sequence of different tissue contrasts acquired at a small FOV, high spatial resolution, and low temporal resolution. Which type of imaging occurs can be related to catheter movement and can be controlled by image acquisition parameter control software. The image acquisition parameters can be set and reset in response to catheter motion information derived from MR signal acquisition, providing improvements over systems that simply identify and/or describe a catheter position.

Certain illustrative example methods, systems, computer readable media and so on are described herein in connection with the following description and the annexed drawings. These examples are indicative, however, of but a few of the various ways in which the principles of the methods, systems, computer readable media and so on may be employed and thus are intended to be inclusive of equivalents. Other advantages and novel features may become apparent from the following detailed description when considered in conjunction with the drawings.

BRIEF DESCRIPTION OF THE DRAWINGS

FIG. 7 is a schematic block diagram of an example computing environment with which the systems, methods and so on described herein may interact and/or be a part of.

DETAILED DESCRIPTION

Figure 1:
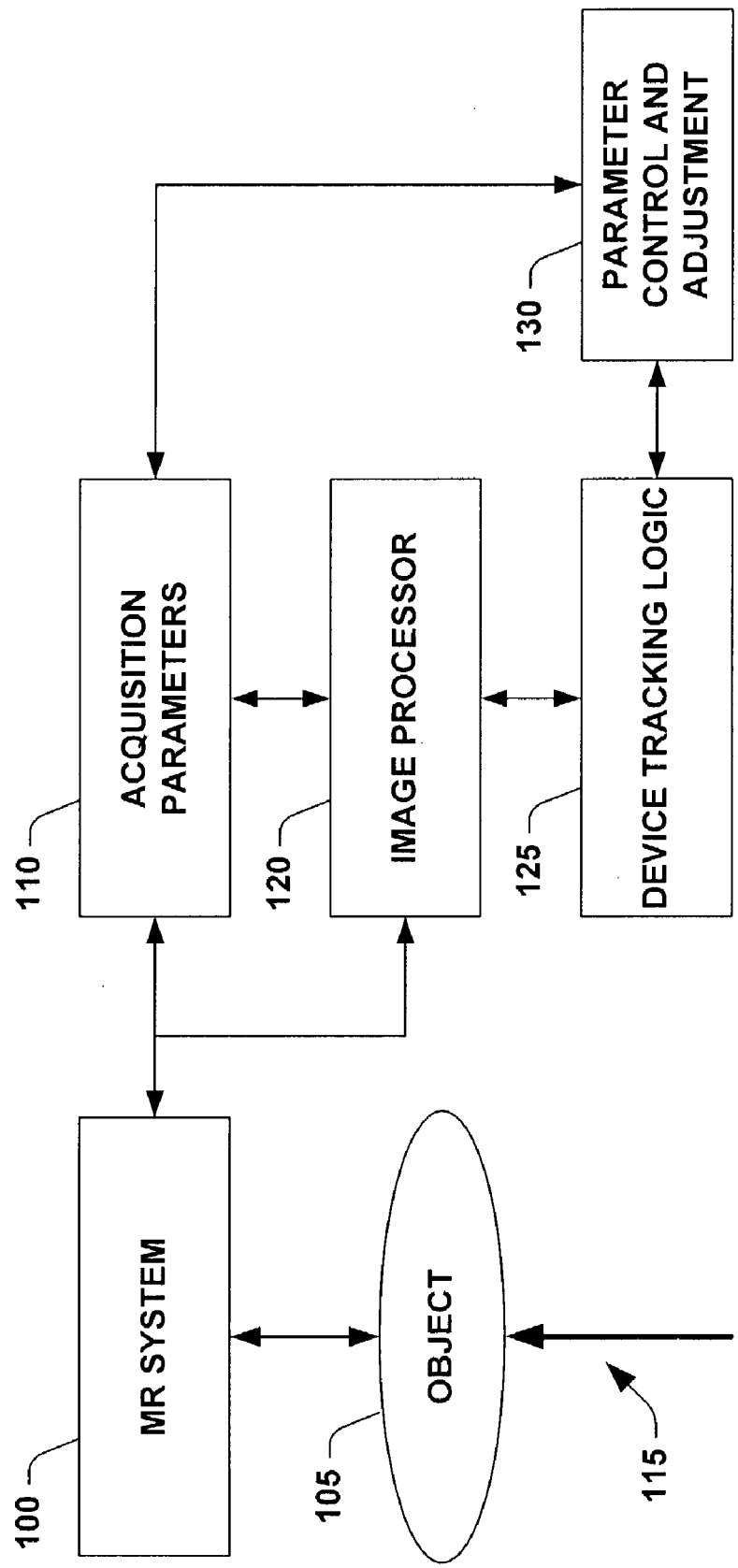
FIG. 1 illustrates an example MR system that automatically adjusts acquisition parameters based on tracking information.

Example systems, methods, computer media, and so on are now described with reference to the drawings, where like reference numerals are used to refer to like elements throughout. In the following description, for purposes of explanation, numerous specific details are set forth in order to facilitate thoroughly understanding the methods, systems, and so on. It may be evident, however, that the methods, systems, computer readable media, and so on can be practiced without these specific details. In other instances, well-known structures and devices are shown in block diagram form in order to simplify description.

As used in this application, the term "computer component" refers to a computer-related entity, either hardware, firmware, software, a combination thereof, or software in execution. For example, a computer component can be, but is not limited to being, a process running on a processor, a processor, an object, an executable, a thread of execution, a program and a computer. By way of illustration, both an application running on a server and the server can be computer components. One or more computer components can reside within a process and/or thread of execution and a computer component can be localized on one computer and/or distributed between two or more computers.

"Computer communications", as used herein, refers to a communication between two or more computers and can be, for example, a network transfer, a file transfer, an applet transfer, an email, a hypertext transfer protocol (HTTP) message, a datagram, an object transfer, a binary large object (BLOB) transfer, and so on. A computer communication can occur across, for example, a wireless system (e.g., IEEE 802.11), an Ethernet system (e.g., IEEE 802.3), a token ring system (e.g., IEEE 802.5), a local area network (LAN), a wide area network (WAN), a point-to-point system, a circuit switching system, a packet switching system, and so on.

"Logic", as used herein, includes but is not limited to, hardware, firmware, software and/or combinations of each to perform a function(s) or an action(s). For example, based on a desired application or needs, logic may include a software controlled microprocessor, discrete logic like an application specific integrated circuit (ASIC), or other programmed logic device. Logic may also be fully embodied as software.

An "operable connection" is one in which signals and/or actual communication flow and/or logical communication flow may be sent and/or received. Usually, an operable connection includes a physical interface, an electrical interface, and/or a data interface, but an operable connection may include differing combinations of these or other types of connections sufficient to allow operable control.

"Signal", as used herein, includes but is not limited to, one or more electrical or optical signals, analog or digital, one or more computer instructions, a bit or bit stream, or the like.

"Software", as used herein, includes but is not limited to, one or more computer readable and/or executable instructions that cause a computer or other electronic device to perform functions, actions and/or behave in a desired manner. The instructions may be embodied in various forms like routines, algorithms, modules, methods, threads, and/or programs. Software may also be implemented in a variety of executable and/or loadable forms including, but not limited to, a stand-alone program, a function call (local and/or remote), a servelet, an applet, instructions stored in a memory, part of an operating system or browser, other executable instructions, and the like. It is to be appreciated that the computer readable and/or executable instructions can be located in one computer component and/or distributed between two or more communicating, co-operating, and/or parallel processing computer components and thus can be loaded and/or executed in serial, parallel, massively parallel, and other manners. It will be appreciated by a person of ordinary skill in the art that the software form may depend, for example, on requirements of a desired application, on the environment in which it runs, and/or on the desires of a designer/programmer or the like.

"TR" as used herein refers to repetition time.

"TE" as used herein refers to echo time.

With reference to FIG. 1, one example system that automatically adjusts image acquisition parameters based on device tracking information is shown. A magnetic resonance (MR) system 100 scans and collects radio frequency signals from an object 105 being imaged. The scan can be performed, for example, using MR techniques known in the art. The scan is undertaken in accordance with pre-determined, configurable, acquisition parameters 110 that define settings in the MR system. Example parameters include, but are not limited to, image slice position, slice orientation, slice thickness, slice rotation, scan pattern, table motion, FOV, image resolution, type of acquisition (e.g., spin echo, steady state), tip angle, image contrast, temporal resolution, spatial resolution, bandwidth, trajectory, TR, TE, and so on.

The object 105 (e.g., human, animal) has a device 115 (e.g., catheter) inserted into it. The device 115 is selectively and controllably moved within the object 105. For example, a physician and/or operator can position and reposition the device 115. An image processor 120 generates images from the collected signal data using one or more transformation techniques known in the art. Device tracking logic 125 is configured to determine various properties of the catheter, (e.g., position, speed, speed rate of change, direction of travel, orientation, distance from a landmark). In one example, catheter tracking information is obtained by determining the catheter location in one or more first images of the object 105 obtained by the MR system 100 and comparing that location to the catheter location in one or more second images. In another example, rather than obtaining catheter tracking information from the imaging data, catheter tracking information is derived from catheter tracking data acquired during the MRI. Thus, a data analysis/reconstruction system (not illustrated) may be added to the system to facilitate device tracking where the device tracking does not involve image data.

Identifying the time intervals and catheter displacements between images facilitates determining the catheter speed, rate of change of speed, direction of travel, and so on. In one example, the device tracking data sets contain information from which an image can be reconstructed. In another example, the device tracking data sets contain information sufficient to track the catheter but from which an image could not be reconstructed. Thus, less data than is necessary to reconstruct an image may suffice to track the inserted device.

A parameter control and adjustment logic 130 may dynamically modify the acquisition parameters 110 for subsequent imaging. The dynamic modification can be based, at least in part, on the catheter position, speed, rate of change of speed, and direction of travel, for example. By way of illustration, if the catheter speed decreases, the image acquisition resolution may be increased. This example correlation is based on a presumption that if the catheter slows or stops moving in a region, it may be in a more interesting region than when the catheter is moving quickly through a region. Thus, higher resolution images may be desired. Other types of correlations and relationships between the catheter properties and the acquisition parameters 110 based on other presumptions or desires may also be predetermined in a similar manner and stored in the parameter control and adjustment logic 130. A manual override like a switch (e.g., manual, voice operated, foot operated) may also be included. In general, the system can make automatic adjustments to the image acquisition parameters 110 based on selected feedback from the acquisition process. The feedback can include, but is not limited to, catheter position, catheter speed, rate of change of catheter speed, catheter direction of travel, local object temperature, and so on. Thus, the systems and methods described herein facilitate novel ways for a user to interface with a scanner. For example, the user can adjust various parameters using only the catheter, whereas conventionally the user may have to employ a keyboard or mouse to interface with the scanner. By way of illustration, rather than modifying an imaging parameter based on catheter speed, the user may adjust contrast or switch pulse sequences by manipulating the catheter.

Figure 2:
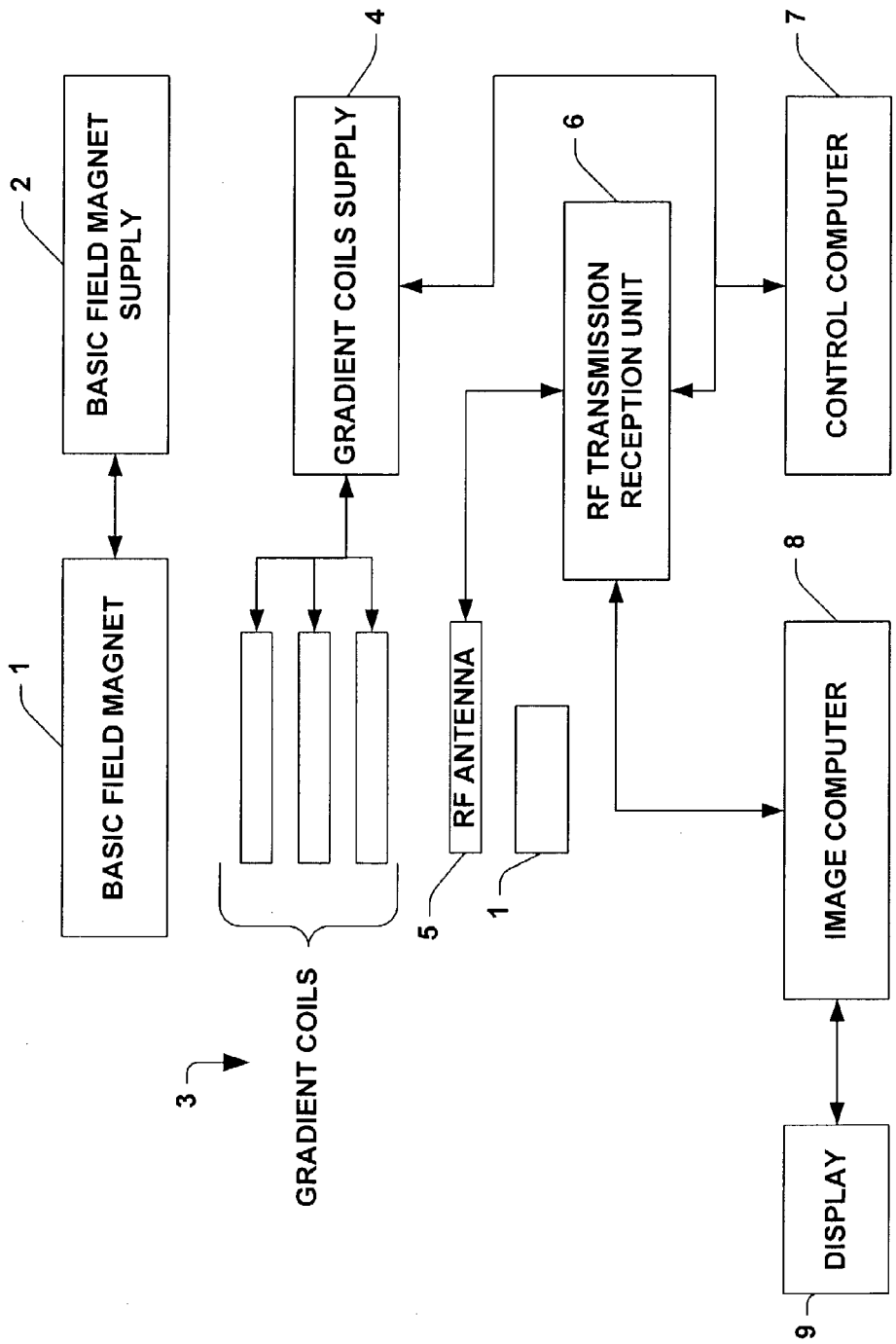
FIG. 2 illustrates an example MRI system.

FIG. 2 illustrates one example magnetic resonance apparatus. Other MRI apparatus are known to those skilled in the art and along with other well-known systems are not illustrated herein for the sake of brevity. The apparatus includes a basic field magnet 1 supplied by a basic field magnet supply 2. The system has gradient coils 3 for respectively emitting gradient magnetic fields $G_S$, $G_P$ and $G_R$, operated by a gradient coils supply 4. An RF antenna 5 is provided for generating the RF pulses, and for receiving the resulting magnetic resonance signals from an object being imaged and/or a device (e.g., catheter) inserted therein. The RF antenna 5 is operated by an RF transmission/reception unit 6. The RF antenna 5 may be employed for transmitting and receiving, or alternatively, separate coils can be employed for transmitting and receiving. The gradient coils supply 4 and the RF transmission/reception unit 6 are operated by a control computer 7 to produce radio frequency pulses that are directed to the object to be imaged. The magnetic resonance signals received from the RF antenna 5 are subject to a transformation process, like a two dimensional fast Fourier Transform (FFT), which generates pixelated image data. The transformation may be performed by an image computer 8 or other similar processing device. The image data may then be shown on a display 9. The image data may include images of both the object to be imaged and an inserted device like a catheter. Subsequent images may facilitate determining the progress, speed, acceleration, and so on of the inserted device by comparing its location at various times. While image data is described, it is to be appreciated that MR signal data other than data sufficient to reconstruct an image can be employed in device tracking. Similarly, CT and/or PET signal data other than data sufficient to reconstruct an image can be employed in device tracking.

The example systems shown in FIGS. 1 and 2 change how acquisition parameters are updated as compared to conventional systems that change parameters manually. Initial acquisition parameters may be programmed in a configurable manner that attempts to anticipate user needs. Then, values for the acquisition parameters are recomputed based on information that comes back during the acquisition process, in other words, feedback from the acquired images and/or tracking data. In one example, as a catheter is inserted, it may be desired to have image slices follow the catheter. In this case, the system determines the catheter tip location and, substantially in real-time, reprograms the acquisition parameters. It may also be desired to know the location of a slice and its orientation so that the slice position and orientation can follow the catheter.

One application of the systems and methods described herein is to facilitate characterizing vulnerable arterial plaque via MRI. Unfortunately, the vast dimensions of the vascular tree have conventionally prevented high resolution imaging from being performed at many locations. Using an example system, as a doctor interested in examining arterial plaque inserts a catheter into a patient, the MR system images an artery wall using a first set of image acquisition parameters (e.g., FOV, resolution). This facilitates initially locating candidate sites for vascular disease. The MR system also images the location of the catheter. If the doctor encounters an area that warrants closer inspection, the doctor can slow the catheter movement, or, after passing over an area that looked interesting, can back up to get a closer look. These changes in motion can be identified by device tracking logic and interpreted by parameter control and adjustment logic so that subsequent images are taken with a second set of image acquisition parameters (e.g., smaller FOV, higher resolution). When the close inspection is done, the catheter speed will again increase as the physician travels to a new location, and thus the image acquisition parameters may return to the first set of parameters. For example, when the catheter speed decreases, the parameter control and adjustment logic may interpret the changes as a desire to have the acquisition parameters automatically change to facilitate taking higher resolution images or taking images with different contrast still centered on the catheter location. The system is configured so that the hardware for determining the coil position and orientation, and the software that controls the MR acquisition work interactively to provide feedback information to the system control software that facilitates determining whether changes should be made to how the acquisition is performed.

In another example, if the catheter stops, the system may automatically change the field of view. A smaller FOV facilitates taking more magnified views of the anatomy around the catheter. Thus, in vascular applications, as a user navigates the catheter through a patient, they can "zoom in" and "zoom out" using a natural, configurable human/machine interface based on correlating catheter motion with user intention. In this example correlation, the FOV is linked to the catheter speed and/or motion.

While an MR system is described in FIG. 1, it is to be appreciated that imaging parameters can be recomputed from feedback produced in other systems like CT systems. In CT scanning, a gantry rotates a patient table and moves the patient. Similarly, in one type of MR, the table upon which the object to be imaged is located may move while image acquisition stays at one position, for example. By programming parameter control logic, the acquisition path information can interactively cause the acquisition pitch to change, to speed up or slow down the table motion. Changing table motion parameters is also applicable to other types of imaging systems.

In another example, the systems and methods automatically adjust, substantially in real-time, designated image scanning parameter values, based on the catheter location relative to previously identified underlying anatomy. By way of illustration, as a catheter tip approaches the root of the aorta and coronary artery origin, the systems and methods may automatically decrease the field of view and increase the spatial resolution to facilitate selecting the artery with the catheter tip.

In one example, continuous 3D device localization via fiducial coils is used not only to automatically update scan plane positions, but also to determine the speed of an interventional device (e.g., catheter). The system can then use the device speed to adjust values of designated imaging scan plane parameters substantially in real time. For example, as the movement of the device is slowed, the system can be set to automatically increase the resolution or signal to noise based on the velocity of the device, while simultaneously affecting a decrease in frame rate and/or FOV.

Figure 3:
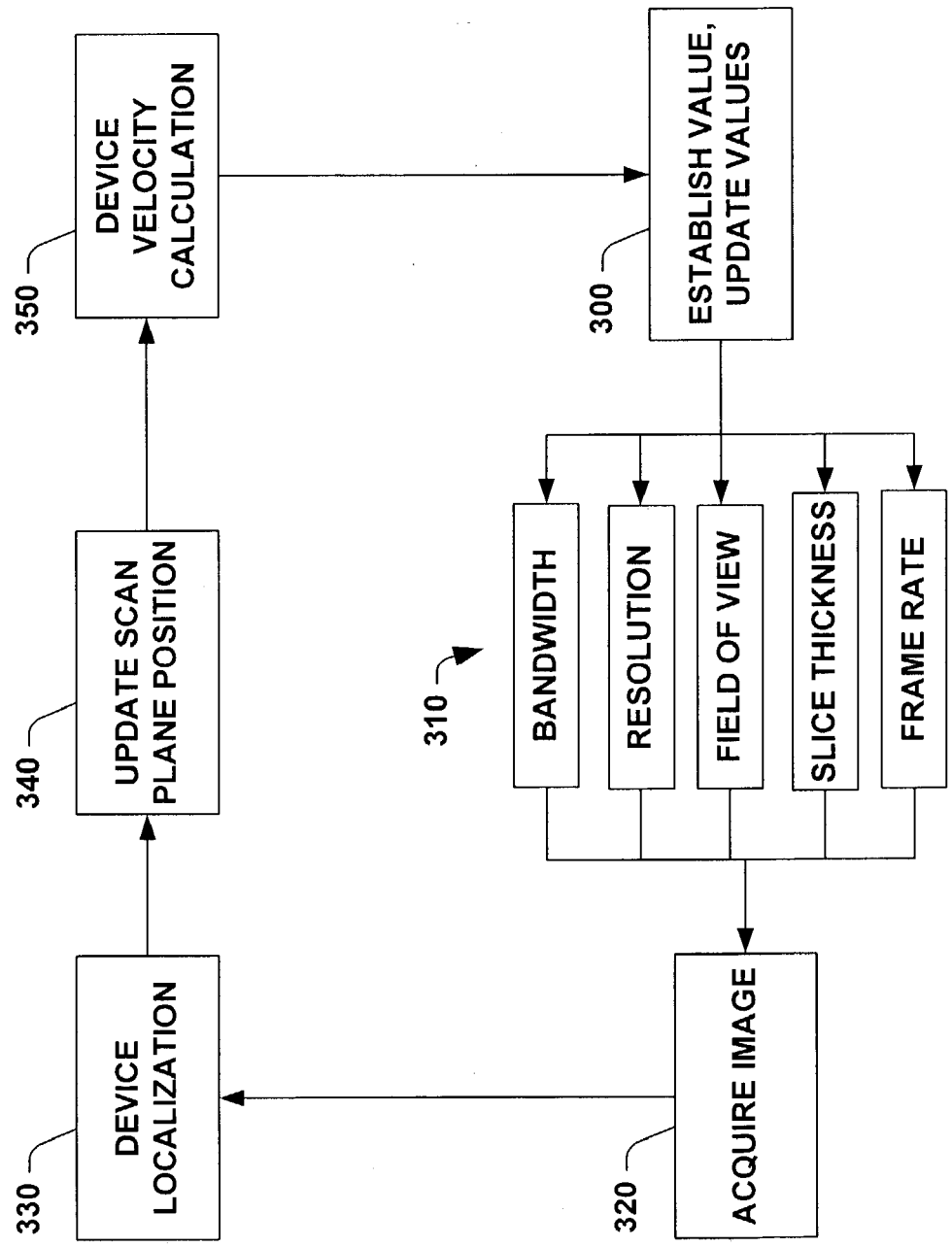
FIG. 3 illustrates an example process flow for an adaptive imaging system.

FIG. 3 illustrates an example process flow for adaptive tracking systems and methods. The process flow may be implemented, for example, as an analytic radial localization method in Siemens' pulse sequence (IDEA) and image reconstruction (ICE) software. One localization technique includes collecting eight radial projections between each acquisition of image data. The localization procedure output is fed back to the pulse sequence software and used to automatically update the imaging scan plane position. The result was automated device tracking where the scan plane was consistently positioned relative to the catheter. Thus, the catheter position can be fed back to the MR components employed to determine the scan plane to facilitate scanning where a user has positioned the catheter.

The adaptive image parameter capabilities can be incorporated into software in an MR system. The localization feedback from multiple time points is used to calculate the speed of the device. The number of time points used for a given speed calculation is a variable that is adjustable through the scanner user interface, which allows a user to adjust how sensitive the system will be to changes in device speed. The system uses the output of the speed calculation to adjust user-defined imaging parameters. The parameter values are updated before acquiring slice images.

Thus, the process flow in FIG. 3 includes, at 300, establishing initial image acquisition parameters. For example, parameters 310 can include, but are not limited to, bandwidth, resolution, FOV, slice thickness, frame rate, and so on. At 320, an image is acquired. The image can include data associated with a device inserted into an object to be imaged.

At 330, device localization occurs. As described above, and in references known in the art, localization can be achieved by various manners. Once device localization has occurred, at 340, scan plan position and other imaging aspects can be updated based, at least in part, on the localization of 330.

At 350, device parameters including, but not limited to, speed, rate of change of speed (acceleration), direction of travel, distance from a landmark, device orientation, and the like, can be computed. Based on these computations, at 300, the parameters 310 can be updated for the next iteration of the process. In one example, the device parameters are computed from image data. In another example, device parameters are computed from device tracking data, where the device tracking data would likely not suffice for image reconstruction.

Figure 4:
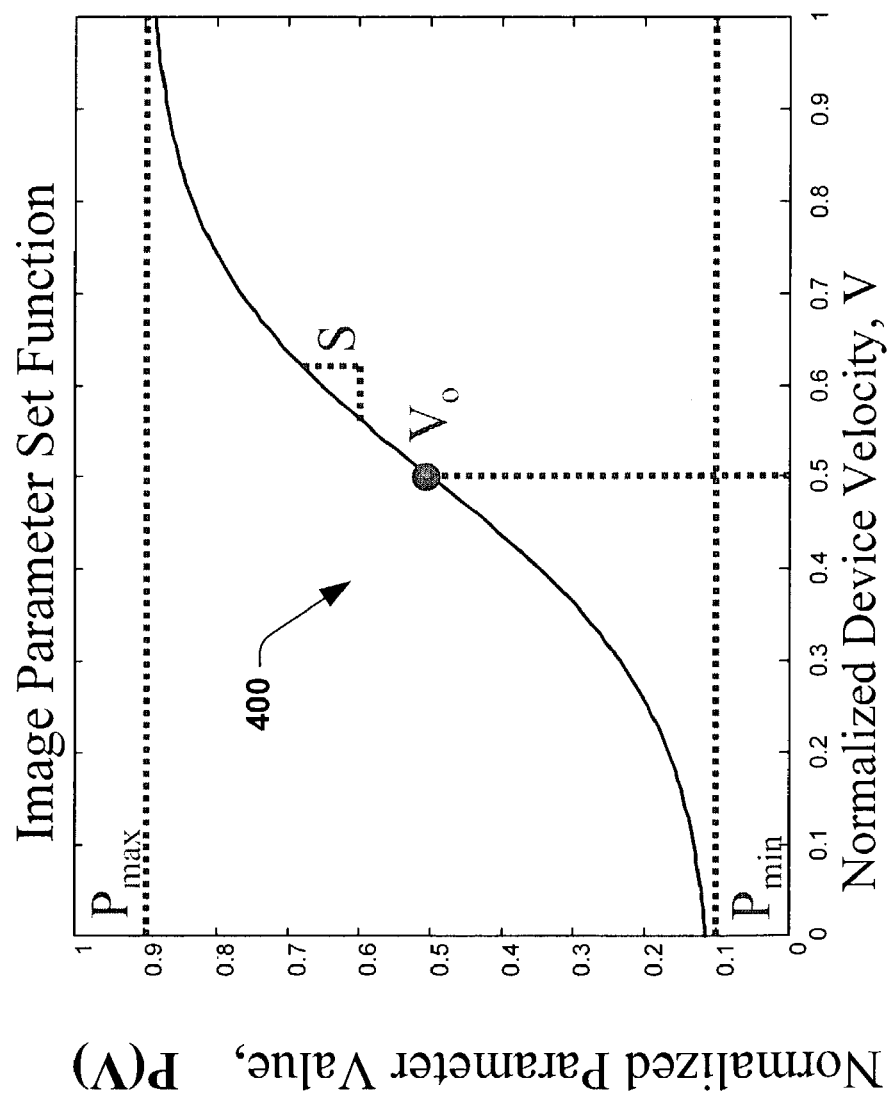
FIG. 4 illustrates a graph of an example sigmoidal function used to set image parameters in an example system.

In one example, the adaptive scan plane parameter values 310 are set (e.g., established, updated) according to a sigmoidal function like that illustrated by curve 400 in FIG. 4. It is to be appreciated that the sigmoidal function illustrated in FIG. 4 is but one example function and that other functions and function types can be used to facilitate adjusting image parameter values. The upper and lower asymptotes $P_{max}$ and $P_{min}$ prevent parameters from being set in ranges that would cause the pulse sequence to exceed hardware limitations. These functions also have static sensitivities S and default set points that can be adjusted via a standard user interface. Mathematically, these properties are characterized by the following equation:

$$P(V) = P_{\min} + \frac{P_{\max} - P_{\min}}{1 + e^{-S*(V-V_o)}}$$

where V is the device velocity, P(v) is the image parameter value, $V_o$ is the velocity set point, S is the static sensitivity of the function, and $P_{min}$ and $P_{max}$ are the lower and upper limits on the acceptable values for the parameter, respectively. In FIG. 4, example parameters are ($P_{min}$=0.1, $P_{max}$=0.9, S=7, and $V_o$=0.5). Additionally and/or alternatively a threshold function and/or other functional relationship(s) could be employed.

Figure 5:
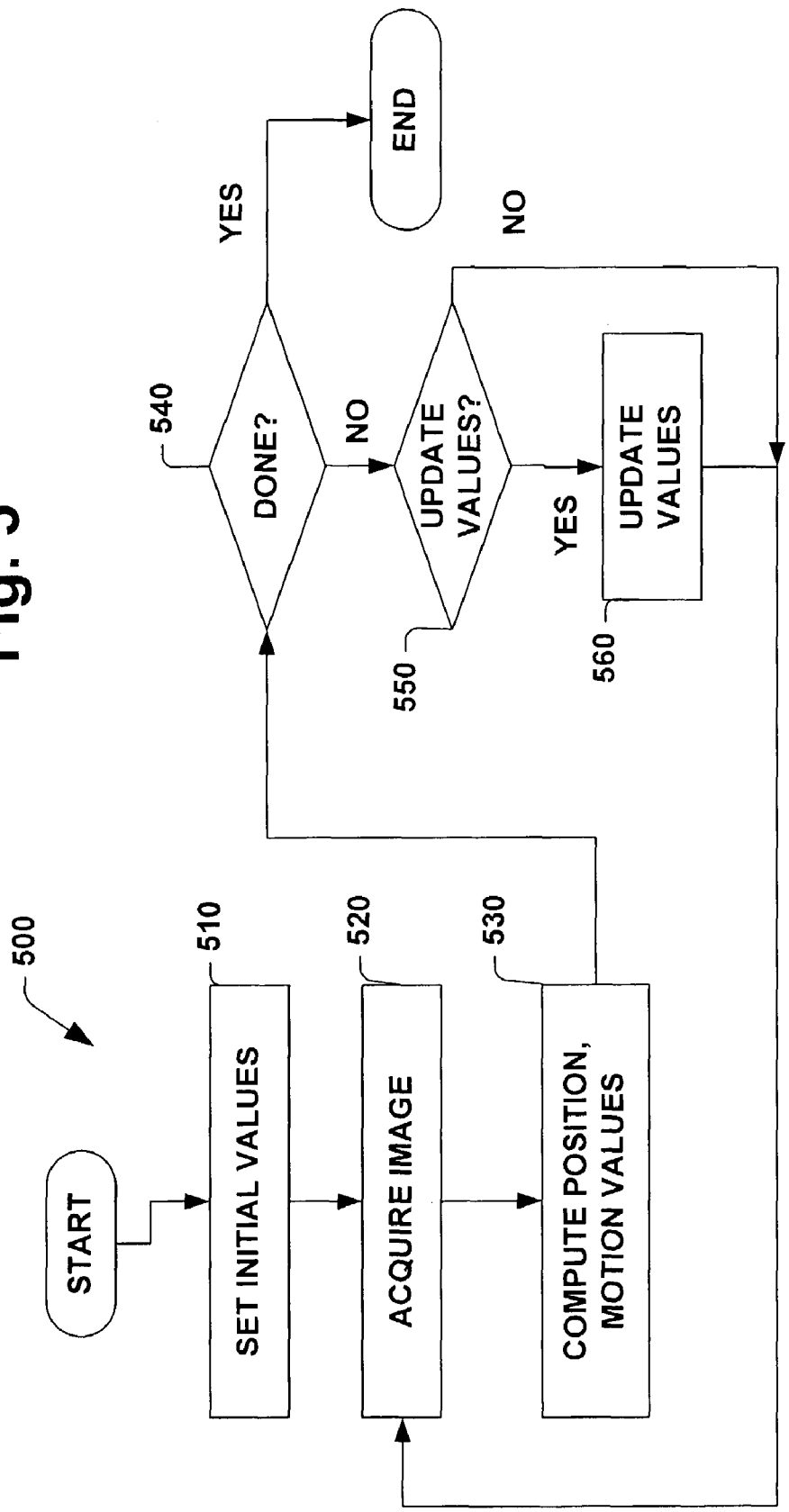
FIG. 5 is a flow chart of an example method for automatically adjusting image acquisition parameters based on tracking information.
Figure 6:
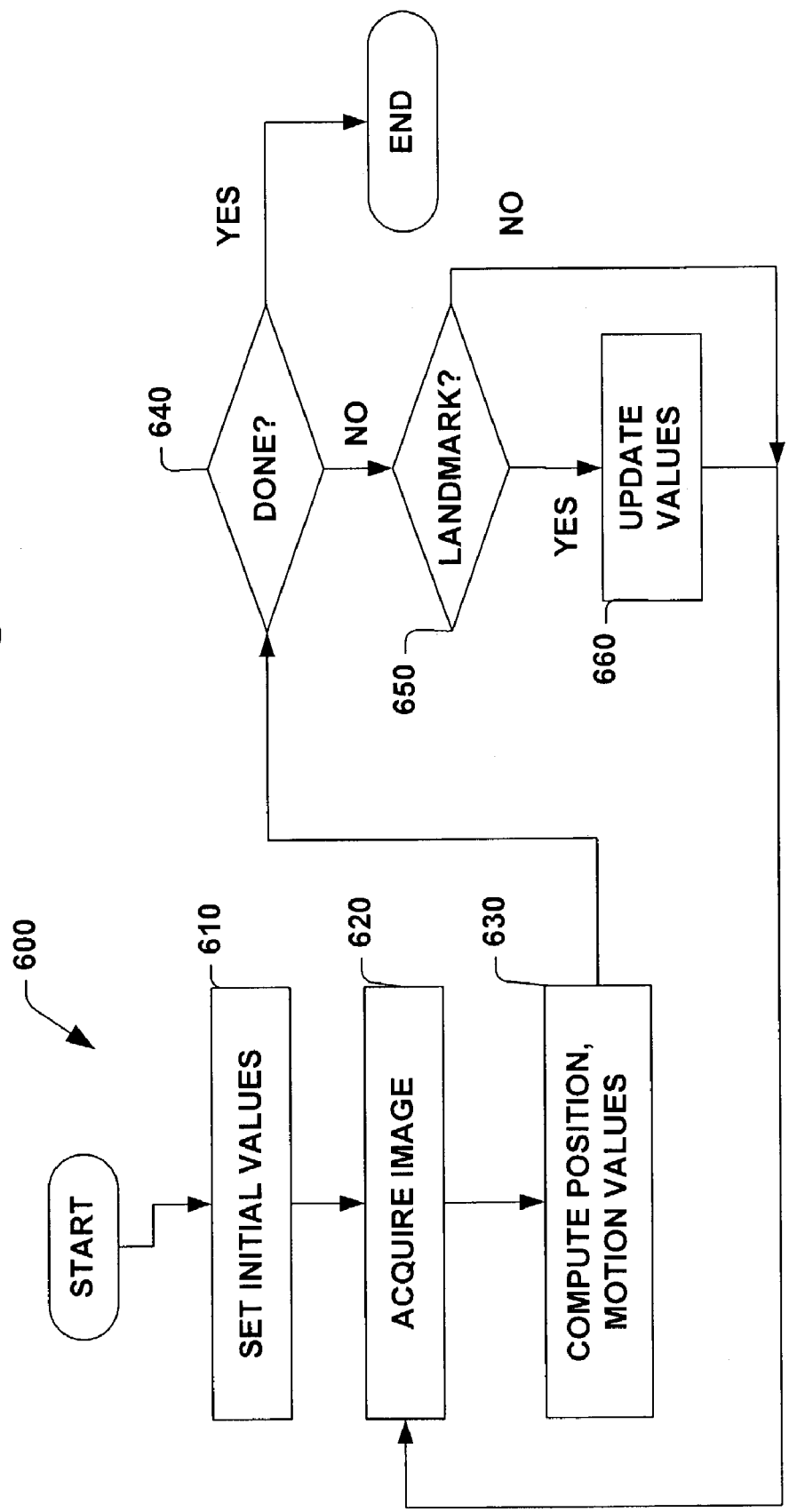
FIG. 6 is a flow chart of an example method for automatically adjusting image acquisition parameters based on tracking information.

In view of the exemplary systems shown and described herein, example methodologies that are implemented will be better appreciated with reference to the flow diagrams of FIGS. 5 and 6. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Furthermore, additional and/or alternative methodologies can employ additional, not illustrated blocks. In one example, methodologies are implemented as computer executable instructions and/or operations, stored on computer readable media including, but not limited to an application specific integrated circuit (ASIC), a compact disc (CD), a digital versatile disk (DVD), a random access memory (RAM), a read only memory (ROM), a programmable read only memory (PROM), an electronically erasable programmable read only memory (EEPROM), a disk, a carrier wave, and a memory stick.

In the flow diagrams, rectangular blocks denote "processing blocks" that may be implemented, for example, in software. Similarly, the diamond shaped blocks denote "decision blocks" or "flow control blocks" that may also be implemented, for example, in software. Alternatively, and/or additionally, the processing and decision blocks can be implemented in functionally equivalent circuits like a digital signal processor (DSP), an ASIC, and the like.

A flow diagram does not depict syntax for any particular programming language, methodology, or style (e.g., procedural, object-oriented). Rather, a flow diagram illustrates functional information one skilled in the art may employ to program software, design circuits, and so on. It is to be appreciated that in some examples, program elements like initializing loops and variables, use of temporary variables, routine loops, and so on are not shown.

FIG. 5 illustrates an example method 500 for automatically updating image acquisition parameters based on device tracking feedback. At 510, initial values are established for one or more image acquisition parameters. The values may be entered manually and/or read, for example, from a computer memory, a computer readable medium, a database, and so on. Since the initial images are likely to be associated with navigating a device inserted in a body, the initial acquisition parameters are likely to be selected to facilitate navigation.

At 520, one or more images are acquired. The images can include image data concerning the object being imaged and image data associated with the device inserted into the object. Thus, at 530, the position, location relative to a landmark, motion, speed, acceleration, and so on of the device can be computed by, for example, comparing a series of time separated images. In another example, at 520, along with images being acquired, non-image device tracking data is acquired. Then, at 530, the position, location and so on can be computed from this non-image device tracking data.

At 540, a determination is made concerning whether imaging is complete. If so, processing can conclude. Otherwise, at 550, a determination is made concerning whether to update one or more acquisition values. For example, the determination may depend on the direction of travel and acceleration of the inserted device, or, it may depend solely on the speed of the device. If the determination at 550 is NO, then at 520 subsequent image(s) can be acquired. But if the determination at 550 is YES, then at 560, one or more image acquisition parameter values are updated and then a subsequent image(s) can be acquired.

It is to be appreciated that one or more images can be acquired at 520 before the computations of 530 and/or determinations of 540 and 550 are performed. Similarly, additional numerical processing (e.g., data smoothing, Kalman filter processing) can be performed before computing at 530.

FIG. 6 illustrates an example method 600 for automatically updating image acquisition parameters based on a different type of device tracking feedback. At 610, initial values are established for one or more image acquisition parameters. The values may be entered manually and/or read, for example, from a computer memory, a computer readable medium, a database, and so on. Since the initial images are likely to be associated with navigating a device inserted in a body, the initial acquisition parameters are likely to be selected to facilitate navigation.

At 620, one or more images are acquired. The images can include image data concerning the object being imaged and image data associated with the device inserted into the object. Thus, at 630, the position, location relative to a landmark, motion, speed, acceleration, and so on of the device can be computed by, for example, comparing a series of time separated images. In another example, at 620, along with images being acquired, non-image device tracking data is acquired. Then, at 630, the position, location and so on can be computed from this non-image device tracking data.

At 640, a determination is made concerning whether imaging is complete. If so, processing can conclude. Otherwise, at 650, a determination is made concerning the position of the device relative to a landmark (e.g., stent, pacemaker, heart valve). If the device has approached the landmark to within a pre-determined, configurable distance, then at 660 one or more image acquisition parameters can be updated. Thus, once again, image acquisition parameters can be updated based on device tracking.

Figure 7:
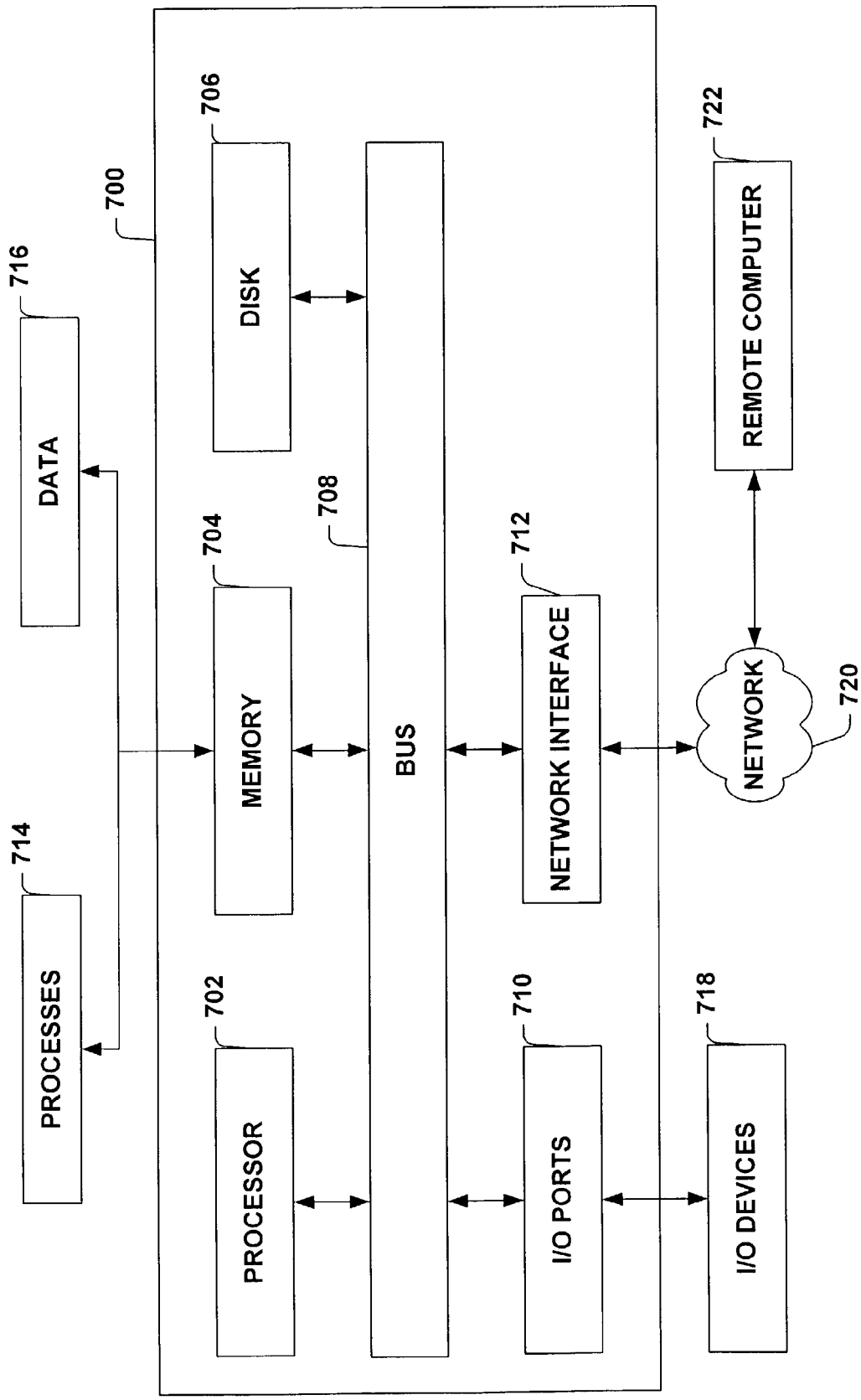

FIG. 7 illustrates a computer 700 that includes a processor 702, a memory 704, a disk 706, input/output ports 710, and a network interface 712 operably connected by a bus 708. Executable components of the systems described herein may be located on a computer like computer 700. Similarly, computer executable methods described herein may be performed on a computer like computer 700. It is to be appreciated that other computers may also be employed with the systems and methods described herein. The processor 702 can be a variety of various processors including dual microprocessor and other multi-processor architectures.

The memory 704 can include volatile memory and/or nonvolatile memory. The nonvolatile memory can include, but is not limited to, read only memory (ROM), programmable read only memory (PROM), electrically programmable read only memory (EPROM), electrically erasable programmable read only memory (EEPROM), and the like. Volatile memory can include, for example, random access memory (RAM), synchronous RAM (SRAM), dynamic RAM (DRAM), synchronous DRAM (SDRAM), double data rate SDRAM (DDR SDRAM), and direct RAM bus RAM (DRRAM). The disk 706 can include, but is not limited to, devices like a magnetic disk drive, a floppy disk drive, a tape drive, a Zip drive, a flash memory card, and/or a memory stick. Furthermore, the disk 706 can include optical drives like, compact disk ROM (CD-ROM), a CD recordable drive (CD-R drive), a CD rewriteable drive (CD-RW drive) and/or a digital versatile ROM drive (DVD ROM). The memory 704 can store processes 714 and/or data 716, for example. The data 716 can include, for example, initial image acquisition values and/or updated acquisition values. The disk 706 and/or memory 704 can store an operating system that controls and allocates resources of the computer 700.

The bus 708 can be a single internal bus interconnect architecture and/or other bus architectures. The bus 708 can be of a variety of types including, but not limited to, a memory bus or memory controller, a peripheral bus or external bus, and/or a local bus. The local bus can be of varieties including, but not limited to, an industrial standard architecture (ISA) bus, a microchannel architecture (MSA) bus, an extended ISA (EISA) bus, a peripheral component interconnect (PCI) bus, a universal serial (USB) bus, and a small computer systems interface (SCSI) bus.

The computer 700 interacts with input/output devices 718 via input/output ports 710. Input/output devices 718 can include, but are not limited to, a handle attached to an insertable device like a catheter, a keyboard, a microphone, a pointing and selection device, cameras, video cards, displays, and the like. The input/output ports 710 can include, but are not limited to, serial ports, parallel ports, and USB ports.

The computer 700 can operate in a network environment and thus is connected to a network 720 by a network interface 712. Through the network 720, the computer 700 may be logically connected to a remote computer 722. Thus, the methods described herein may be distributed between two or more communicating, co-operating computers. The network 720 can include, but is not limited to, local area networks (LAN), wide area networks (WAN), and other networks. The network interface 712 can connect to local area network technologies including, but not limited to, fiber distributed data interface (FDDI), copper distributed data interface (CDDI), ethernet/IEEE 802.3, token ring/IEEE 802.5, and the like. Similarly, the network interface 712 can connect to wide area network technologies including, but not limited to, point to point links, and circuit switching networks like integrated services digital networks (ISDN), packet switching networks, and digital subscriber lines (DSL).

Figure 8:
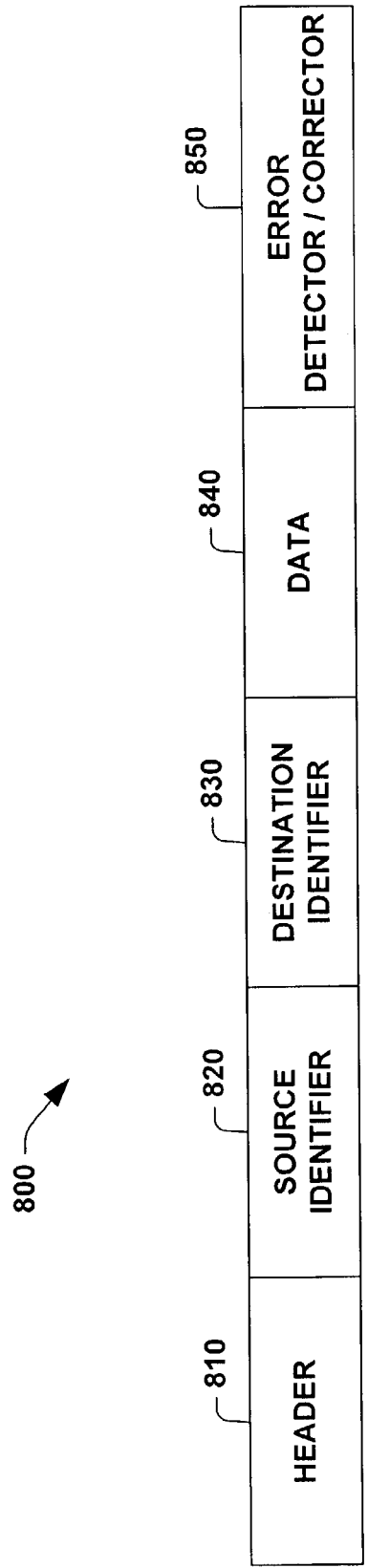
FIG. 8 illustrates an example data packet that can be employed by the systems and/or methods described herein.

Referring now to FIG. 8, information can be transmitted between various computer components associated with automated image acquisition parameter updating based on device tracking feedback as described herein via a data packet 800. The information may be transmitted, for example, in a computer communication. An exemplary data packet 800 is shown. The data packet 800 includes a header field 810 that includes information like the length and type of packet. A source identifier 820 follows the header field 810 and includes, for example, an address of the computer component from which packet 800 originated. Following the source identifier 820, the packet 800 includes a destination identifier 830 that holds, for example, an address of the computer component to which the packet 800 is ultimately destined. Source and destination identifiers can be, for example, globally unique identifiers (guids), URLS (uniform resource locators), path names, and the like. The data field 840 in the packet 800 includes various information intended for the receiving computer component. The data packet 800 ends with an error detecting and/or correcting field 850 whereby a computer component can determine if it has properly received the packet 800.

While five fields are illustrated in the data packet 800, it is to be appreciated that a greater and/or lesser number of fields can be present in data packets. The data packet 800 may be sent, for example, between MR image acquiring computer components located in a first location to MR image analyzing components located in a second location. For example, a state wide hospital system may have a number of MR systems deployed throughout the state. The hospital system may have a central location for MR image analysis. In one example, the MR systems deployed at various sites could generate data packets and transmit them via computer communications to the central site for analysis. The analysis could include determining the motion of an inserted device (e.g., catheter) and, substantially in real time, updating image acquisition parameters associated with the MR.

Figure 9:
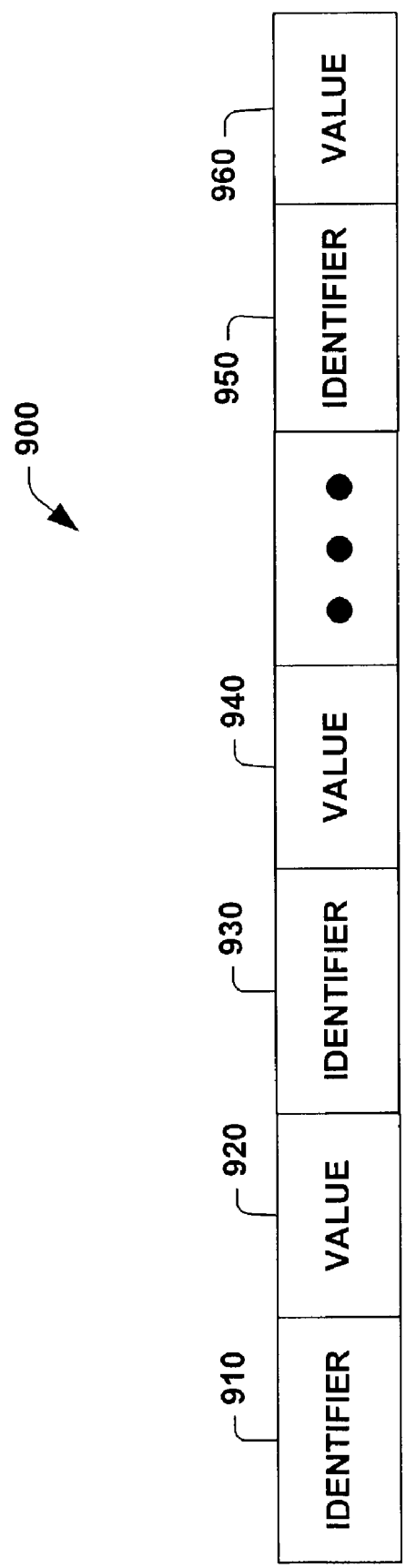
FIG. 9 illustrates example data subfields that can be employed in a data packet.

FIG. 9 is a schematic illustration of example sub-fields 900 within the data field 840 (FIG. 8). The sub-fields 900 discussed are merely exemplary and it is to be appreciated that a greater and/or lesser number of sub-fields could be employed with various types of data germane to automatically updating image acquisition parameters based on real time feedback associated with device tracking. The sub-fields 900 include a field 910 that stores, for example, information concerning identifying an image acquisition parameter. Field 920 then may be associated with field 910 and hold a value for the image acquisition parameter identified in field 910. While identifier/value pairs are illustrated, it is to be appreciated that the sub-fields 900 may be arranged in a pre-determined order or according to a schema and thus there may not be identifiers. Furthermore, the sub-fields 900 may be suitable for importing into a file like an XML file. In one example, the sub-fields 900 may store one or more image acquisition parameters including, but not limited to, image slice position, slice orientation, slice thickness, slice rotation, scan pattern, table motion, FOV, image resolution, type of acquisition (e.g., spin echo, steady state), tip angle, image contrast, temporal resolution, spatial resolution, bandwidth, trajectory, TR, and TE. In another example, the sub-fields 900 may store one or more feedback parameters like catheter position, catheter speed, rate of change of speed, distance to a landmark, and the like.

Figure 10:
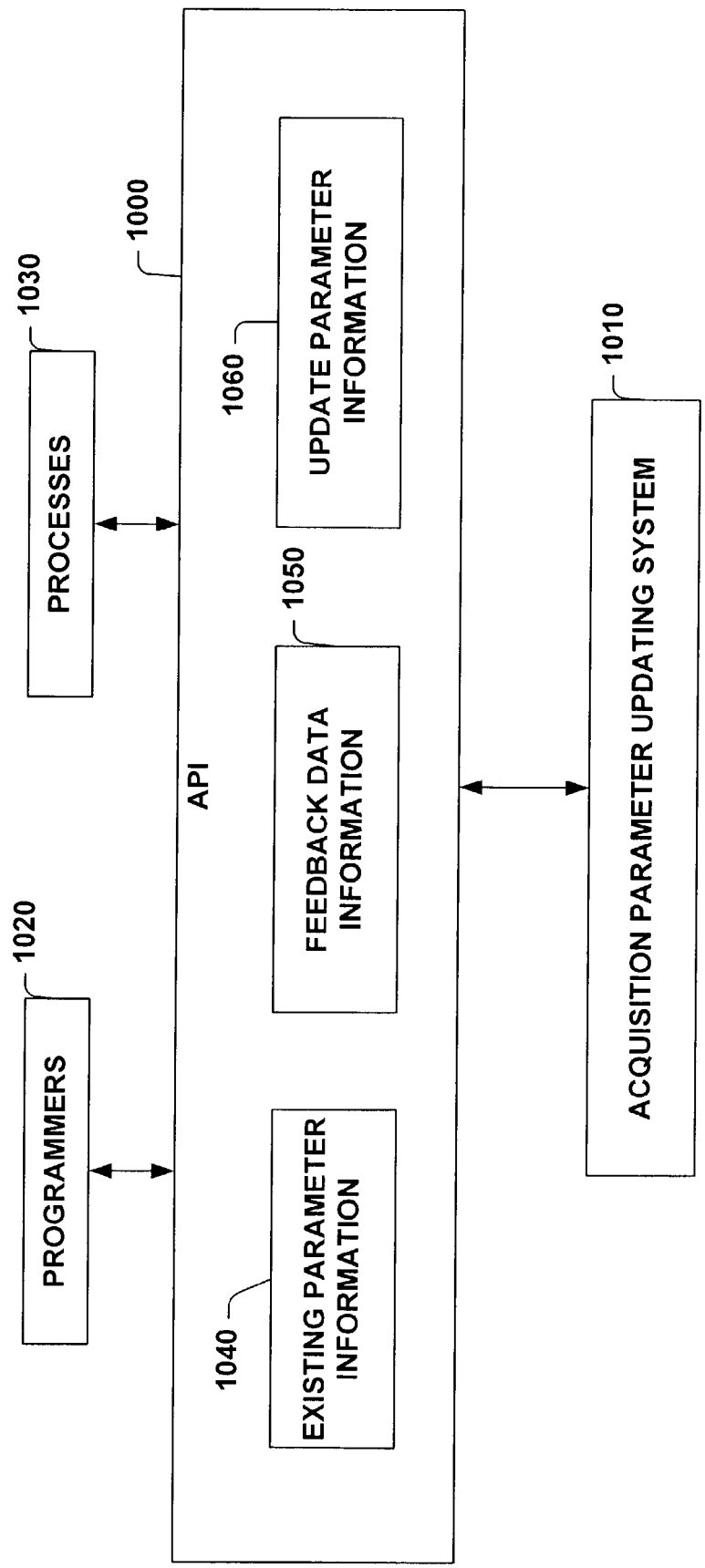
FIG. 10 illustrates an example API that can be employed by the systems and/or methods described herein.

Referring now to FIG. 10, an application programming interface (API) 1000 is illustrated providing access to a system 1010 for automatically updating image acquisition parameters based on imaging feedback. The API 1000 can be employed, for example, by programmers 1020 and/or processes 1030 to gain access to processing performed by the system 1010. For example, a programmer 1020 can write a program to access the system 1010 for automatically updating image acquisition parameters (e.g., to invoke its operation, to monitor its operation, to access its functionality) where writing a program is facilitated by the presence of the API 1000. Thus, rather than the programmer 1020 having to understand the internals of the system 1010, the programmer's task is simplified by merely having to learn the interface to the system 1010. This facilitates encapsulating the functionality of the system 1010 while exposing that functionality.

Similarly, the API 1000 can be employed to provide data values to the system 1010 and/or retrieve data values from the system 1010. For example, a process 1030 that receives device location information and/or computes device speed and/or acceleration can provide data to the system 1010 and/or programmers 1020 via the API 1000 by, for example, using a call provided in the API 1000. Thus, in one example of the API 1000, a set of application program interfaces can be stored on a computer-readable medium. The interfaces can be executed by a computer component to gain access to a system 1010. Interfaces can include, but are not limited to, a first interface 1040 that facilitates transmitting and/or receiving an existing image acquisition parameter data associated with acquiring an MR image of both an object and an inserted device, a second interface 1050 that facilitates transmitting and/or receiving a feedback data associated with a position and/or motion information of the inserted device, and a third interface 1060 that facilitates receiving an updated image acquisition parameter data generated from the initial parameter data and the feedback data.

Figure 11:
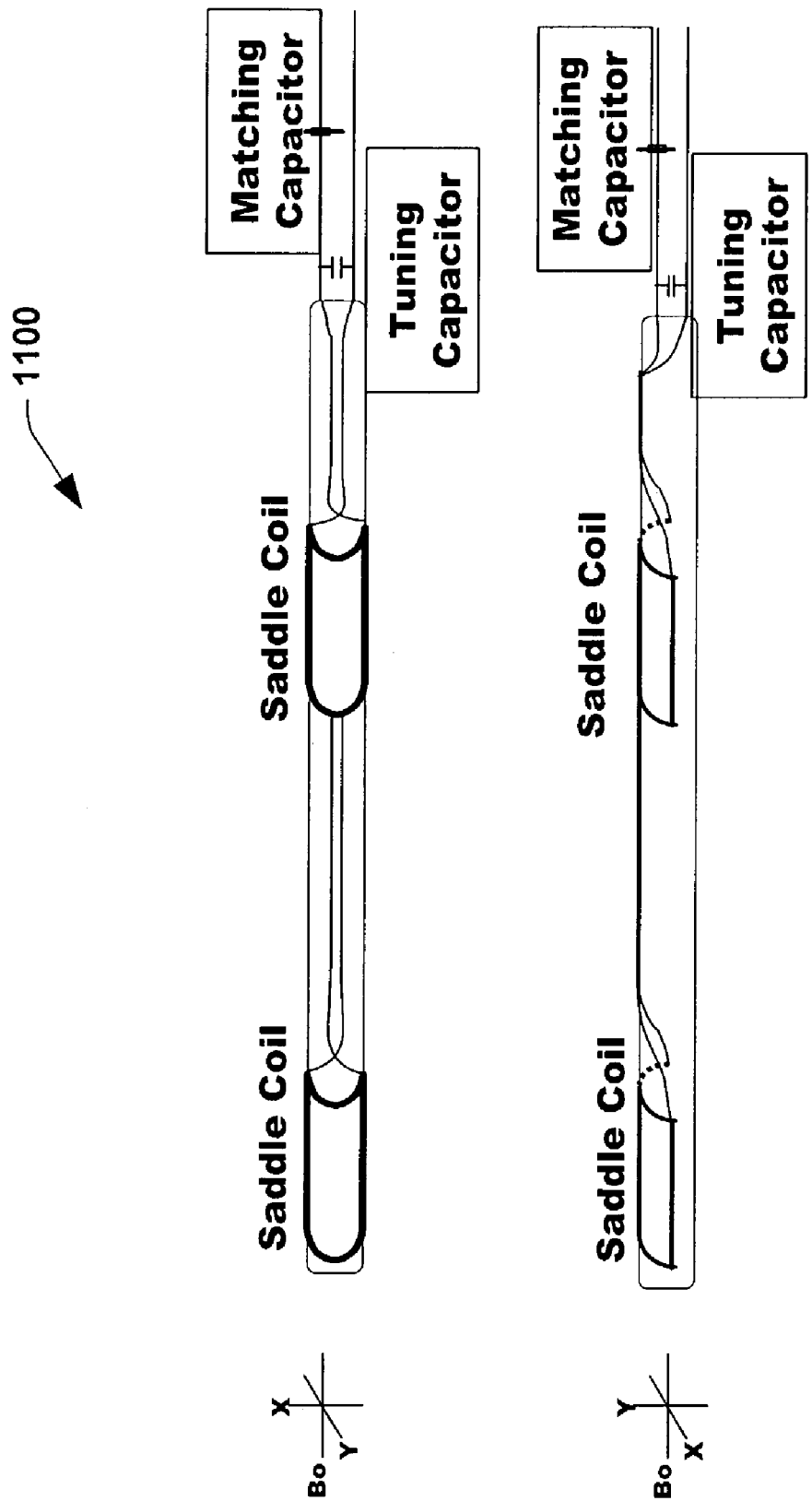
FIG. 11 illustrates an example catheter tip that can be employed with the systems and methods described herein.

FIG. 11 illustrates two views of one example catheter tip 1100 that can be employed with the systems and methods described herein. Although capacitively coupled coils are illustrated, the systems and methods described herein can employ other types of markers including, but not limited to inductively coupled markers, and chemically shifted internal signal source markers.

The systems, methods, and objects described herein may be stored, for example, on a computer readable media. Media can include, but are not limited to, an ASIC, a CD, a DVD, a RAM, a ROM, a PROM, a disk, a carrier wave, a memory stick, and the like. Thus, an example computer readable medium can store computer executable instructions for a method for acquiring images of an object in a magnetic resonance imaging system where an object being imaged has a device inserted into it. The example method can include establishing image acquisition parameter values and then acquiring images of the object and the device inserted in the object in accordance with the initial image acquisition parameter values. Additionally, and/or alternatively, device tracking signal data, rather than image data may be acquired with respect to the inserted device. The example method also includes tracking the device motion by analyzing its position in different images and/or in different sets of device tracking data. For example, the location in a first image taken at a first, known time, can be compared with its location in a second image taken at a second, known time, and the difference in location coupled with the difference in time can be used to compute speed, acceleration, and so on. The example method may also include automatically adjusting the image acquisition parameters based on the device movement. The acts of establishing parameter values, acquiring images, computing speed/acceleration, and automatically adjusting values can continue until imaging is complete.

What has been described herein includes several examples. It is, of course, not possible to describe every conceivable combination of components or methodologies for purposes of describing the systems, methods, computer readable media and so on employed in automatically updating image acquisition parameters based on image feedback. However, one of ordinary skill in the art may recognize that further combinations and permutations are possible. Accordingly, this application is intended to embrace alterations, modifications, and variations that fall within the scope of the appended claims.

Furthermore, to the extent that the term "includes" is employed in the detailed description or the claims, it is intended to be inclusive in a manner similar to the term "comprising" as that term is interpreted when employed as a transitional word in a claim.

While the systems, methods and so on described herein have been illustrated by describing examples, and while the examples have been described in considerable detail, it is not the intention of the applicants to restrict or in any way limit the scope of the appended claims to such detail. Additional advantages and modifications will be readily apparent to those skilled in the art. Therefore, the invention, in its broader aspects, is not limited to the specific details, the representative apparatus, and illustrative examples shown and described. Accordingly, departures may be made from such details without departing from the spirit or scope of the applicant's general inventive concept.

What is claimed is:

1. A system, comprising:
    an imaging system programmed to acquire image signal data from an object being imaged, the imaging being based on one or more image acquisition parameters, the object having a device inserted therein;
    a device tracking system programmed to acquire device tracking signal data associated with the device inserted in the object;
    a processor;
    a memory; and
    an interface to connect a group of logics, the group of logics comprising:
        logic programmed to track the device from the device tracking signal data and to determine one or more device properties from the device tracking signal data, where at least one device property is a velocity measurement for the device; and
        logic programmed to automatically adjust one or more of the image acquisition parameters based, at least in part, on the one or more device properties, the one or more image acquisition parameters comprising: image slice position, slice orientation, slice thickness, slice rotation, scan pattern, field of view, image resolution, type of acquisition, tip angle, image contrast, temporal resolution, spatial resolution, bandwidth, trajectory, TR, and TE.

2. The system of claim 1, where the device is a catheter.

3. The system of claim 2, where the device tracking signal data is image signal data.

4. The system of claim 1, where the logic for tracking includes logic for comparing two or more sets of device tracking signal data and determining a location of the device in the object being imaged.

5. The system of claim 1, where the logic for tracking includes logic for comparing two or more images generated from the image signal data and determining a location of the device in an image.

6. The system of claim 1, where the one or more device properties include one or more of, a speed of the device, a rate of change of the speed of the device, and a direction of travel of the device.

7. The system of claim 1, where the one or more device properties are, the speed of the device, the rate of change of speed of the device, and the velocity measurement of the device.

8. The system of claim 1, where the one or more properties are the velocity of the device and the acceleration of the device.

9. The system of claim 1, where the image acquisition parameters are the field of view and the image resolution.

10. The system of claim 1, where the
    logic for adjusting one or more of the image acquisition parameters is configured to automatically adjust an image parameter by manipulating a pulse sequence used by one or more of, the imaging system, and the device tracking system.

11. The system of claim 1, where the logic programmed to automatically adjust performs adjustment automatically according to one or more of a sigmoidal function and a threshold function.

12. The system of claim 1, comprising a manual override that allows a user to manually override the logic programmed to automatically adjust.

13. The system of claim 1, where the logic programmed to automatically adjust one or more of the image acquisition parameters operates in response to device manipulation according to one or more of a sigmoidal function and a threshold function.

14. The system of claim 1, where the device tracking signal data includes data sufficient to track the device, but from which an image cannot be reconstructed.

15. The system of claim 1, where the image signal data and device tracking signal data are different from one another.

16. A method for acquiring images of an object in a magnetic resonance imaging (MRI) system in accordance with one or more acquisition parameters, where the object being imaged has a device inserted therein, comprising:
    controlling the MRI system to establish one or more established image acquisition parameter values;
    controlling the MRI system to acquire one or more images of the object in accordance with the one or more established acquisition parameters;
    controlling the MRI system to acquire one or more sets of device tracking data associated with the device inserted in the object;
    controlling the MRI system to track a device movement by analyzing one or more first sets of device tracking data to determine a first location of the device;
    controlling the MRI system to analyze analyzing one or more second sets of device tracking data to determine a second location,
    controlling the MRI system to compare the first location to the second location to determine a velocity measurement;
    controlling the MRI system to automatically adjust one or more of the established image acquisition parameters for acquiring subsequent images based on the velocity measurement, where the one or more of the established image acquisition parameters include at least one of, image slice position, slice orientation, slice thickness, slice rotation, scan pattern, field of view, image resolution, type of acquisition, tip angle, image contrast, temporal resolution, spatial resolution, bandwidth, trajectory, TR, and TE; and
    repetitively acquiring, tracking and automatically adjusting until imaging is completed.

17. The method of claim 16, where establishing an image acquisition parameter comprises configuring an RF pulse sequence that controls one or more of a gradient magnetic field Gs, a gradient magnetic field Gp, and a gradient magnetic field Gr controlled by the magnetic resonance imaging system.

18. The method of claim 16, where automatically adjusting an image acquisition parameter comprises reconfiguring the RF pulse sequence.

* * * * *

UNITED STATES PATENT AND TRADEMARK OFFICE
CERTIFICATE OF CORRECTION

| | | |
|---|---|---|
| PATENT NO. | : 7,894,877 B2 | Page 1 of 1 |
| APPLICATION NO. | : 10/437661 | |
| DATED | : February 22, 2011 | |
| INVENTOR(S) | : Lewin et al. | |

It is certified that error appears in the above-identified patent and that said Letters Patent is hereby corrected as shown below:

Claims:

In claim 16, column 14, line 39, delete "analyzing".

Signed and Sealed this
Seventeenth Day of May, 2011

David J. Kappos
*Director of the United States Patent and Trademark Office*